US011754638B2

(12) United States Patent
Lin et al.

(10) Patent No.: US 11,754,638 B2
(45) Date of Patent: Sep. 12, 2023

(54) GROUND FAULT DETECTION APPARATUS AND METHOD OF DETECTING GROUND FAULT

(71) Applicant: DELTA ELECTRONICS, INC., Taoyuan (TW)

(72) Inventors: Hung-Chieh Lin, Taoyuan (TW); Jen-Chuan Liao, Taoyuan (TW); Yi-Ping Hsieh, Taoyuan (TW); Hsin-Chih Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/528,837

(22) Filed: Nov. 17, 2021

(65) Prior Publication Data

US 2023/0049346 A1   Feb. 16, 2023

(30) Foreign Application Priority Data

Aug. 12, 2021   (TW) .................................. 110129718

(51) Int. Cl.
*G01R 31/52* (2020.01)
*H02J 9/06* (2006.01)

(52) U.S. Cl.
CPC .............. *G01R 31/52* (2020.01); *H02J 9/061* (2013.01)

(58) Field of Classification Search
CPC .......... G01R 31/52; H02J 9/061; H02J 9/062; H02H 3/165
See application file for complete search history.

(56) References Cited

U.S. PATENT DOCUMENTS 6,314,007 B2 * 11/2001 Johnson, Jr. ........ H02M 5/4585
363/58
2012/0212172 A1    6/2012  Valdez et al.
(Continued)

FOREIGN PATENT DOCUMENTS

CN     101614777 A  * 12/2009  ............. G01R 31/02
CN     102645607 A     8/2012
(Continued)

OTHER PUBLICATIONS

Guerrero et al., "Ground Fault Detection Method for Variable Speed Drives," in IEEE Transactions on Industry Applications, vol. 57, No. 3, pp. 2547-2558, May-Jun. 2021 (Year: 2021).*

*Primary Examiner* — Alexander Satanovsky
*Assistant Examiner* — Asm Fakhruddin
(74) *Attorney, Agent, or Firm* — Muncy, Geissler, Olds & Lowe, P.C.

(57) ABSTRACT

A ground fault detection apparatus is used to detect a ground fault of a three-phase UPS apparatus. The UPS apparatus includes a first filter circuit, an AC/DC conversion circuit, a DC bus, a DC/AC conversion circuit, and a second filter circuit coupled in sequence. The ground fault detection apparatus includes a detection circuit having a first detection end and a second detection end. The first detection end is coupled to the first filter circuit and the second filter circuit, and the second detection end is coupled to an equipment grounding point. The equipment grounding point is coupled to a neutral point of a three-phase power source, and the three-phase power source is coupled to the first filter circuit. The detection circuit indicates whether the UPS apparatus has a ground fault and a location where the ground fault occurs according to a detection voltage between the first detection end and the second detection end.

12 Claims, 14 Drawing Sheets

(56) References Cited

U.S. PATENT DOCUMENTS

| | | | | |
|---|---|---|---|---|
| 2014/0139022 A1* | 5/2014 | Bush | ............... | H02M 5/40 |
| | | | | 307/31 |
| 2015/0097571 A1* | 4/2015 | Wei | ............... | G01R 31/52 |
| | | | | 324/531 |
| 2017/0131340 A1* | 5/2017 | Tallam | ............... | B60L 3/04 |
| 2019/0312425 A1* | 10/2019 | Xiao | ............... | H02M 5/451 |
| 2020/0041559 A1 | 2/2020 | Tallam et al. | | |

FOREIGN PATENT DOCUMENTS

| | | | | | |
|---|---|---|---|---|---|
| CN | 103840676 A | | 6/2014 | | |
| CN | 104515928 A | | 4/2015 | | |
| CN | 110350483 A | | 10/2019 | | |
| KR | 20170026695 A | * | 3/2017 | ............... | H02J 9/00 |
| WO | WO-2016144491 A1 | * | 9/2016 | ............... | G01R 31/343 |

\* cited by examiner

GROUND FAULT DETECTION APPARATUS AND METHOD OF DETECTING GROUND FAULT

BACKGROUND

Technical Field

The present disclosure relates to a ground fault detection apparatus and a method of detecting a ground fault, and more particularly to a ground fault detection apparatus used for a three-phase uninterruptible power apparatus and a method of detecting a ground fault.

Description of Related Art

The statements in this section merely provide background information related to the present disclosure and do not necessarily constitute prior art.

Uninterruptible power system (UPS) is usually configured to be coupled between a power source and load equipment. When the power source is abnormal and cannot normally supply power, the UPS can replace the power source to temporarily provide uninterrupted backup power to the load equipment to protect the load equipment from damage. One type of existing UPS will convert the power from the power source to supply power to the load equipment when the power source can normally provide power. On the contrary, when the power source is abnormal, the UPS will convert the stored electric energy of its built-in or external energy storage apparatus (such as lead-acid battery or lithium battery, etc.) to supply backup power to the load equipment. In recent years, the application of UPS has become more and more widespread, and the safety protection measures for UPS have been also getting more and more attention. Since ground faults will seriously affect the personal safety of users, real-time detection of ground faults and indication of the ground fault locations have become one of the most valued functions of UPS.

In general, the types of ground faults that may occur during the operation of a three-phase UPS include: DC bus ground fault, energy storage apparatus ground fault, and any phase of AC output ground fault, etc. In order to avoid extremely large ground-fault current that occurs during a ground fault, a three-phase UPS usually adds high-impedance measures between the neutral point of the three-phase power and the equipment grounding point of the UPS itself, for example, adding a grounding resistor with a high resistance value (e.g., 2 kilo-ohm). Although the above-mentioned high-impedance grounding measures can effectively suppress the ground-fault current, it will cause difficulties in ground fault detection and troubleshooting, and may further cause accidents such as electric shocks.

A traditional ground fault detection method of three-phase UPS is usually to add additional hardware detection circuit to the internal DC bus of the UPS, for example, the hardware detection circuit may include two resistors used to divide the voltage between the positive side and the negative side of the DC bus to form a virtual midpoint, and by monitoring the voltage difference between the virtual midpoint and the ground, it is determined whether a ground fault occurs. Since there is always DC bus voltage on the resistors of the detection circuit, it will continue to consume power and generate heat. In addition to decreasing the overall power conversion efficiency of the UPS, the circuit also requires a lot of space for heat dissipation. In addition, the virtual midpoint and the ground will have a bus voltage as high as ½ during normal operation, and therefore such a high common-mode voltage may easily trigger false detection and increase the difficulty of feedback signal processing.

In addition, when a specific point of the circuit inside the three-phase uninterruptible power apparatus is not well insulated, it will cause a leakage current path between that point and the outer shell/casing of the equipment, resulting in the occurrence of a ground fault. When it is known that a ground fault has occurred, it is also necessary to further know where the three-phase uninterruptible power apparatus actually has the ground fault so as to facilitate the smooth removal of the ground fault.

SUMMARY

In order to solve the above-mentioned problems, the present disclosure provides a ground fault detection apparatus, and the ground fault detection apparatus is used to detect a ground fault of a three-phase uninterruptible power apparatus. The three-phase uninterruptible power apparatus includes an AC/DC conversion circuit, and a DC/AC conversion circuit coupled to the AC/DC conversion circuit through a DC bus. The ground fault detection apparatus includes a detection circuit. The detection circuit includes a first detection end and a second detection end. The first detection end is coupled to a first filter circuit between the AC/DC conversion circuit and a first AC side. The first detection end is coupled to a second filter circuit between the DC/AC conversion circuit and a second AC side, and the second detection end is coupled to an equipment grounding point of the three-phase uninterruptible power apparatus. The equipment grounding point is coupled to a neutral point of a three-phase power source through a grounding resistor, and the three-phase power source is coupled to the first AC side. The detection circuit indicates whether the three-phase uninterruptible power apparatus has a ground fault and a location where the ground fault occurs according to a detection voltage between the first detection end and the second detection end.

In order to solve the above-mentioned problems, the present disclosure provides a method of detecting a ground fault of a three-phase uninterruptible power apparatus. The three-phase uninterruptible power apparatus includes a first filter circuit, an AC/DC conversion circuit, a DC bus, a DC/AC conversion circuit, and a second filter circuit coupled in sequence. A common connection point between the first filter circuit and the second filter circuit is a first detection end, and an equipment grounding point of the three-phase uninterruptible power apparatus is coupled to a second detection end. The equipment grounding point is coupled to a neutral point of a three-phase power source through a grounding resistor. The three-phase power source is coupled to the first filter circuit. The method includes steps of: detecting a detection voltage between the first detection end and the second detection end, determining that a ground fault of the three-phase uninterruptible power apparatus occurs according to a specific voltage value of the detection voltage, and determining a location of the ground fault according to the specific voltage value.

The main purpose and effect of the present disclosure is: compared with the traditional ground fault detection method with the addition of a hardware detection circuit on the DC bus, the present disclosure only needs to detect the detection voltage between the common connection point of the first filter circuit and the second filter circuit and the equipment grounding point. Whether a ground fault occurs and where the specific location of the ground fault is can be determined according to the specific voltage value of the detection voltage, without additional hardware detection circuit required. Therefore, in addition to significantly reducing the difficulty of detection circuit design, the present disclosure can also achieve cost savings, avoid additional power consumption and heat dissipation, reduce the impact of high frequency and high common-mode voltage, and reduce the chance of false detection.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1A:
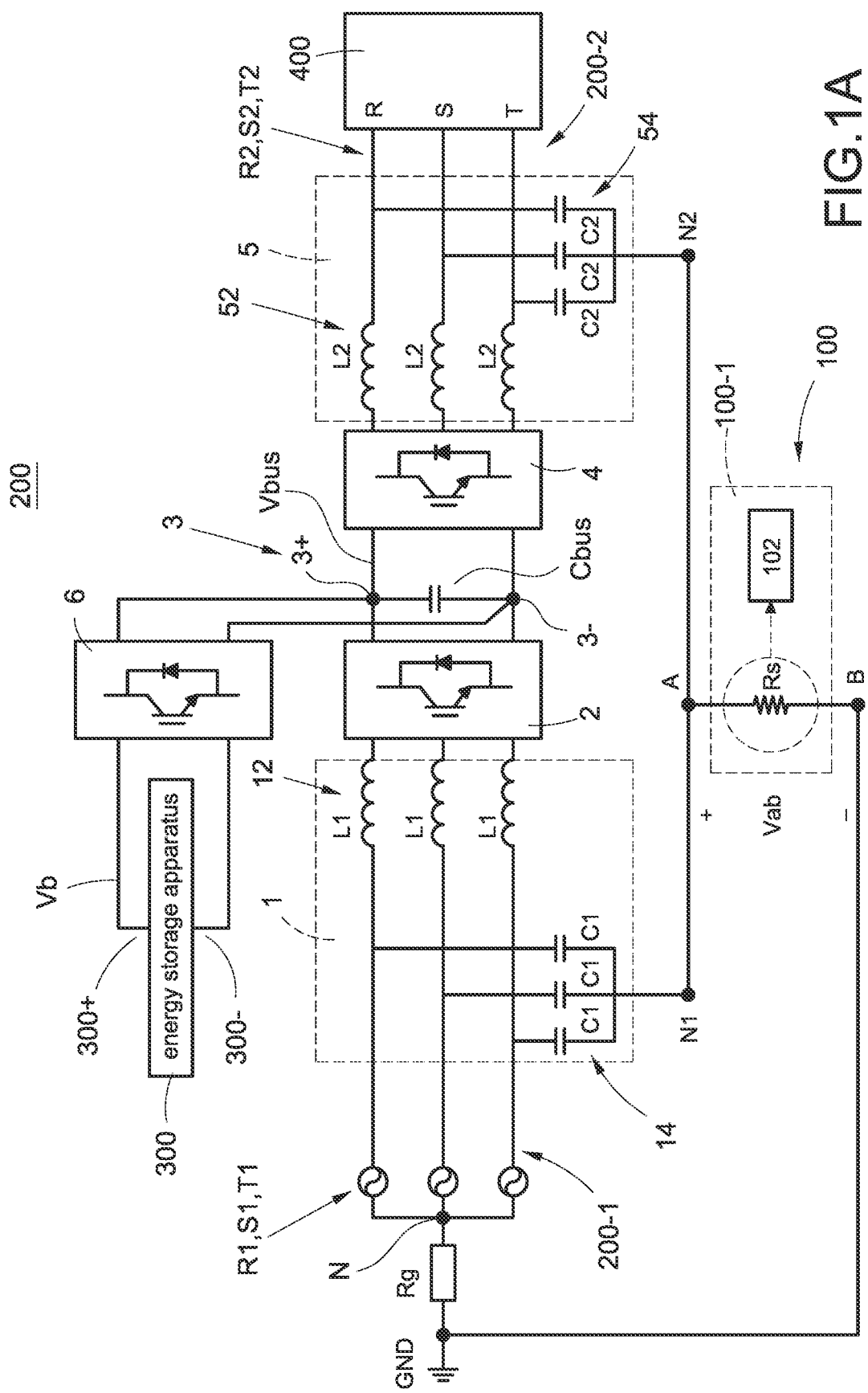
FIG. 1A is a circuit diagram of a ground fault detection apparatus applied to a three-phase uninterruptible power apparatus according to a first embodiment of the present disclosure.

Reference will now be made to the drawing figures to describe the present disclosure in detail. It will be understood that the drawing figures and exemplified embodiments of present disclosure are not limited to the details thereof.

Please refer to FIG. 1A, which shows a circuit diagram of a ground fault detection apparatus applied to a three-phase uninterruptible power apparatus according to a first embodiment of the present disclosure. The ground fault detection apparatus 100 is provided to detect a ground fault of a three-phase uninterruptible power apparatus 200. The three-phase uninterruptible power apparatus 200 includes a first filter circuit 1, an AC/DC conversion circuit 2, a DC bus 3, a DC/AC conversion circuit 4, a second filter circuit 5, and a DC/DC conversion circuit 6. One side of the first filter circuit 1 is a first AC side 200-1, and the first AC side 200-1 is coupled to a first three-phase power source (R1, S1, T1). In particular, the first three-phase power source (R1, S1, T1) may be a power source supplied by a power company or any power apparatus that can provide three-phase power. The first filter circuit 1, take an LC filter circuit as an example, includes a first filtering inductor assembly 12 and a first filtering capacitor assembly 14. The number of first filtering inductors L1 of the first filtering inductor assembly 12 is three, which is corresponding to three phases (R1, S1, T1) of the first three-phase power source. A first end of the first filtering inductor L1 is correspondingly coupled to one phase of the first three-phase power source (R1, S1, T1), and a second end of the first filtering inductor L1 is coupled to the AC/DC conversion circuit 2. The number of first filtering capacitors C1 of the first filtering capacitor assembly 14 is three, which is corresponding to three phases (R1, S1, T1) of the first three-phase power source. A first end of the first filtering capacitor C1 is correspondingly coupled to the first filtering inductor L1, and a second end of the first filtering capacitor C1 is coupled to a first common connection point N1. In particular, the first filtering capacitor C1 may be a Y capacitor, and the capacitance value is preferably 2 uF.

The AC/DC conversion circuit 2 may be a power factor correction (PFC) circuit. A first end of the AC/DC conversion circuit 2 is coupled to the first filter circuit 1, and a second end of the AC/DC conversion circuit 2 is coupled to the DC bus 3. A first end of the DC/AC conversion circuit 4 is coupled to the DC bus 3, and a second end of the DC/AC conversion circuit 4 is coupled to the second filter circuit 5. One side of the second filter circuit 5 is a second AC side 200-2, and the second AC side 200-2 is coupled to a load 400. It is similar to the first filter circuit 1, also take an LC filter circuit as an example for the second filter circuit 5, the second filter circuit 5 includes a second filtering inductor assembly 52 and a second filtering capacitor assembly 54. The number of second filtering inductors L2 of the second filtering inductor assembly 52 is three, which is corresponding to three phases (R2, S2, T2) of the second three-phase power source. A first end of the second filtering inductor L2 is correspondingly coupled to one phase of the second three-phase power source (R2, S2, T2), and a second end of the second filtering inductor L2 is coupled to the DC/AC conversion circuit 4. The number of second filtering capacitors C2 of the second filtering capacitor assembly 54 is three, which is corresponding to three phases (R2, S2, T2) of the second three-phase power source. A first end of the second filtering capacitor C2 is correspondingly coupled to the second filtering inductor L2, and a second end of the second filtering capacitor C2 is coupled to a second common connection point N2. In particular, the second filtering capacitor C2 may be a Y capacitor, and the capacitance value is preferably 2 uF.

A first end of the DC/DC conversion circuit 6 is coupled to a positive side 3+ and a negative side 3− of the DC bus 3, and a second end of the DC/DC conversion circuit 6 is coupled to a positive electrode 300+ and a negative electrode 300− of an energy storage apparatus 300. The energy storage apparatus 300 may be any apparatus used to store electrical energy, such as but not limited to lead-acid batteries, lithium batteries, or super capacitors. When the first three-phase power source (R1, S1, T1) is available to normally supply power to the load 400, the AC/DC conversion circuit 2 converts the AC voltage of the first three-phase power source (R1, S1, T1) into the bus voltage Vbus of the DC bus 3, and the electrical energy of the bus voltage Vbus is stored in a bus capacitor Cbus of the DC bus 3. The DC/AC conversion circuit 4 receives the bus voltage Vbus and converts the bus voltage Vbus into three phase voltages of the second three-phase power source (R2, S2, T2) to supply power to other connected apparatus, such as the load 400. The DC/DC conversion circuit 6 receives the bus voltage Vbus, and converts the bus voltage Vbus into the energy storage voltage Vb to charge the energy storage apparatus 300. The energy storage apparatus 300 is used to provide its backup power to the load 400 when the first three-phase power source (R1, S1, T1) is abnormal and fails to supply power, in this case, the DC/DC conversion circuit 6 receives the energy storage voltage Vb of the energy storage apparatus 300 and converts the energy storage voltage Vb into the bus voltage Vbus. The DC/AC conversion circuit 4 receives the bus voltage Vbus, and converts the bus voltage Vbus into three phase voltages of the second three-phase power source (R2, S2, T2) to supply power to other connected apparatus, such as the load 400.

In particular, the switching of the power switches used for power conversion inside the AC/DC conversion circuit 2, the DC/AC conversion circuit 4, and the DC/DC conversion circuit 6 may be respectively controlled by a controller (not shown) with existing power conversion control methods. Since the present disclosure mainly focuses on ground fault detection for the three-phase uninterruptible power apparatus 200, the control method of each conversion circuit by the controller is not a main feature, and will not be described in detail here.

The ground fault detection apparatus 100 includes a detection circuit 100-1, and the detection circuit 100-1 includes a first detection end A and a second detection end B. The first detection end A is coupled to the first filter circuit 1 and the second filter circuit 5, and the second detection end B is coupled to an equipment grounding point GND of the three-phase uninterruptible power apparatus 200. Specifically, the three-phase uninterruptible power apparatus 200 includes a grounding resistor Rg. A first end of the grounding resistor Rg is coupled to a neutral point N of the first three-phase power source (R1, S1, T1), and a second end of the grounding resistor Rg is coupled to the equipment grounding point GND. The first detection end A of the detection circuit 100-1 is coupled to the first common connection point N1 and the second common connection point N2. In particular, the resistance value of the grounding resistance Rg may be selected as kilo-ohm grade, and the preferable range is 5 kilo-ohm to 1 kilo-ohm. The equipment grounding point GND may be, for example, but not limited to, the outer shell/casing of the three-phase uninterruptible power apparatus 200, etc.

The outer shell/casing of the three-phase uninterruptible power apparatus 200 is usually insulated from the internal circuit and grounded to prevent the user from electric shock when the user touches the outer shell/casing. However, when a certain point of the internal circuit is not well insulated, it may establish a leakage current path between that point and the outer shell/casing of the apparatus, thus leading to a ground fault. On the other hand, when it is known that a ground fault has occurred, it is also necessary to further know where the ground fault occurs in the three-phase uninterruptible power apparatus 200 so as to facilitate the elimination of the ground fault. Therefore, the main purpose and effect of the present disclosure is to use the detection circuit 100-1 coupled between the first common connection point N1, the second common connection point N2, and the equipment grounding point GND to determine whether a ground fault occurs and the specific location of the ground fault according to the specific voltage value of the detection voltage.

Furthermore, the detection circuit 100-1 is used to detect the detection voltage Vab with a specific voltage value between the first detection end A and the second detection end B, and the value of the detection voltage Vab will vary with the ground fault condition of the three-phase uninterruptible power apparatus 200. The detection voltage Vab is used to indicate whether the three-phase uninterruptible power apparatus 200 has a ground fault, and through a mathematical analysis, the specific voltage value of the detection voltage Vab can correspondingly indicate the location of the ground fault. Therefore, the detection circuit 100-1 may be implemented by any means that can detect voltage, for example, but not limited to, using a resistor, an amplifier, or I/O pins of a controller for detection. Therefore, the specific voltage value of the detection voltage can be used to determine the specific location of the ground fault. The detection circuit 100-1, takes a resistor as an example, includes a detection resistor Rs and a control unit 102. The leakage current flowing through the detection resistor Rs will generate the detection voltage Vab between the first detection end A and the second detection end B. Afterward, the control unit 102 is used to determine whether the three-phase uninterruptible power apparatus 200 has a ground fault and the location of the ground fault based on the detection voltage Vab. In one embodiment, the control unit 102 may be an external apparatus, for example, but not limited to a computer, or an oscilloscope, etc. In addition, depending on the power of the three-phase uninterruptible power apparatus 200, the leakage current may be large or small, and therefore a resolution adjustment circuit (not shown) may be additionally implemented to adjust the detection resolution of the detection circuit 100-1. For example, but not limited to, a switch with a resistor connected in series may be used to connect with the detection resistor in parallel, and the switch may be turned on/off according to the magnitude of the leakage current so that the resistor and the detection resistor are connected in parallel or not. Accordingly, the detection circuit 100-1 can be compatible with various three-phase uninterruptible power apparatuses 200 of different powers.

Figure 1B:
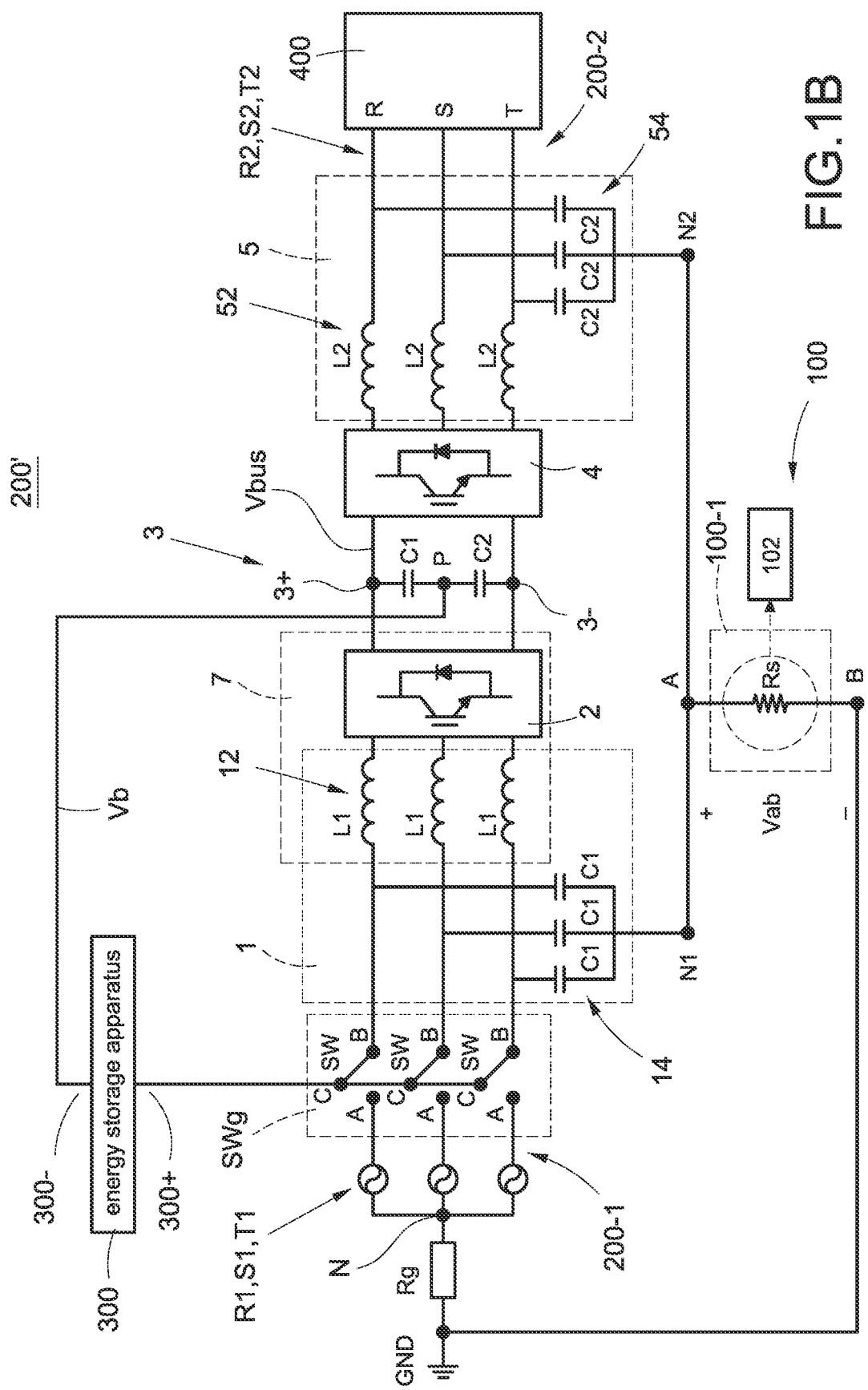
FIG. 1B is a circuit diagram of the ground fault detection apparatus applied to the three-phase uninterruptible power apparatus according to a second embodiment of the present disclosure.

Please refer to FIG. 1B, which shows a circuit diagram of the ground fault detection apparatus applied to the three-phase uninterruptible power apparatus according to a second embodiment of the present disclosure, and also refer to FIG. 1A. The difference between the three-phase uninterruptible power apparatus 200' in FIG. 1B and the three-phase uninterruptible power apparatus 200 in FIG. 1A is that the three-phase uninterruptible power apparatus 200' further includes a first capacitor C1, a second capacitor C2, and a switch assembly SWg.

A first end of the first capacitor C1 is coupled to the positive side 3+ of the DC bus 3, and a second end of the first capacitor C1 is a midpoint P. A first end of the second capacitor C2 is coupled to the negative side 3− of the DC bus3, and a second end of the second capacitor C2 is coupled to the midpoint P. The switch assembly SWg includes a plurality of switches SW, and the number of the switches SW is corresponding to the number of phases of the three-phase uninterruptible power apparatus 200. Specifically, the switch assembly SWg is coupled between the first filter circuit 1 and the first AC side 200-1, and the number of the switches SW of the switch assembly SWg is three so the switches SW can be correspondingly coupled to the three phases of the first three-phase power source (R1, S1, T1) respectively. The switch SW may be a relay having a first end A, a second end B, and a third end C. The first end A is coupled to the first AC side 200-1, the second end B is coupled to the first filter circuit 1, and the third end C is coupled to the positive electrode 300+ of the energy storage apparatus 300, and the negative side 300− of the energy storage apparatus 300 is coupled to the midpoint P. The controller (not shown) of the three-phase uninterruptible power apparatus 200' controls an integrated conversion circuit 7 and the switch assembly SWg for the power conversion of the first three-phase power source (R1, S1, T1), the bus voltage Vbus, and the energy storage voltage Vb. The integrated conversion circuit 7 mainly performs DC-to-DC (DC/DC) or AC-to-DC (AC/DC) power conversion functions according to the voltage it receives, such as a DC voltage (energy storage voltage Vb) or an AC voltage (three-phase power source, R1, S1, T1).

Specifically, when the first three-phase power source (R1, S1, T1) is available to normally supply power, the controller (not shown) controls the first end A of each switch SW to be coupled to the second end B so that the AC voltage of the first three-phase power source (R1, S1, T1) is converted into the bus voltage Vbus of the DC bus 3 by the integrated conversion circuit 7. When the first three-phase power source (R1, S1, T1) is abnormal and fails to supply power, the controller (not shown) controls the third end C of each switch SW to be coupled to the second end B so that the integrated conversion circuit 7 converts the energy storage voltage Vb into the bus voltage Vbus to provide the backup power from the energy storage apparatus 300. Therefore, the conversion between the DC power and the AC power can be realized by the integrated conversion circuit 7 so that the three-phase uninterruptible power apparatus 200' does not need to add a DC/DC conversion circuit 6 (shown in FIG. 1A), thereby saving the cost and size of the circuit. In addition, the controller (not shown) may control the integrated conversion circuit 7 to perform power conversion functions with an existing control method. Since the control method of the controller is not the main feature of the present disclosure, it will not be described in detail here.

Another difference between the three-phase uninterruptible power apparatus 200' in FIG. 1B and the three-phase uninterruptible power apparatus 200 in FIG. 1A is that the detection circuit 100-1' may only include the detection resistor Rs without the control unit 102. The control unit 102 may be included in a controller (not shown) inside the three-phase uninterruptible power apparatus 200', and the controller (not shown) can determine whether the three-phase uninterruptible power apparatus 200' has a ground fault and the location of the ground fault according to the detection voltage Vab, and therefore the ground fault protection mechanism can be immediately activated for the three-phase uninterruptible power apparatus 200'. In one embodiment, either the detection circuit 100-1 in FIG. 1A or the detection circuit 100-1' in FIG. 1B may be chosen according to actual needs. For example, but not limited to, the detection circuit 100-1' shown in FIG. 1B may be used in the three-phase uninterruptible power apparatus 200 shown in FIG. 1A.

Figure 2:
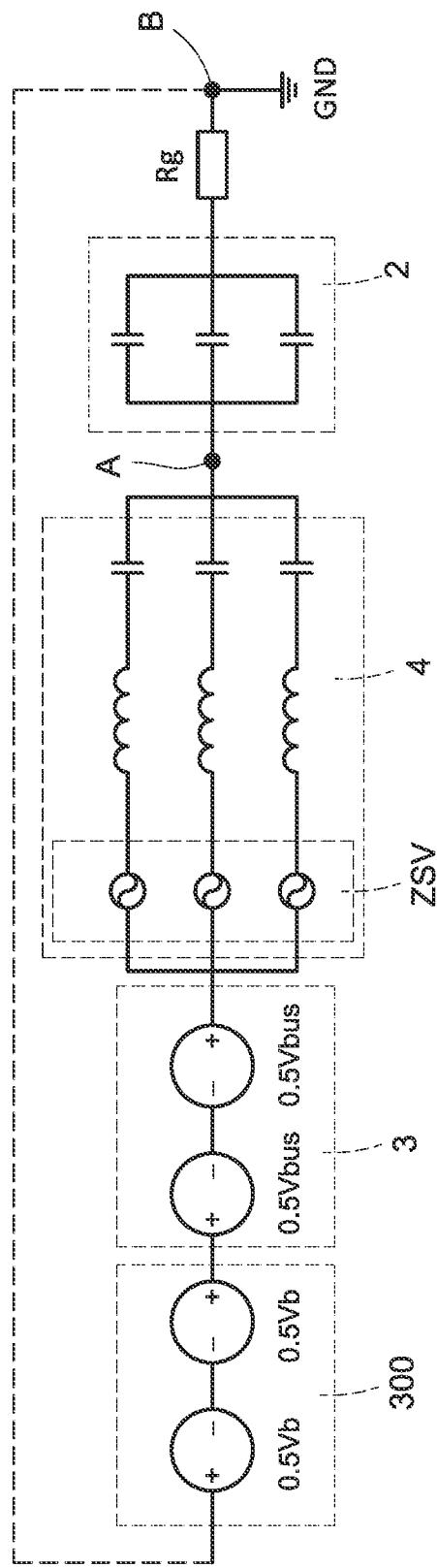
FIG. 2 is an equivalent circuit diagram of the three-phase uninterruptible power apparatus when no ground fault occurs according to the present disclosure.

Please refer to FIG. 2, which shows an equivalent circuit diagram of the three-phase uninterruptible power apparatus when no ground fault occurs according to the present disclosure, and also refer to FIG. 1A and FIG. 1B. When the three-phase uninterruptible power apparatus (200,200') of FIG. 1A or FIG. 1B is in normal operation without a ground fault, its internal circuit may be equivalent to the equivalent circuit shown in FIG. 2. The first detection end A is connected to the equipment grounding point GND through an equivalent AC/DC conversion circuit 2 and a grounding resistor. In addition, the first detection end A is connected to the energy storage apparatus 300 through the equivalent DC/AC conversion circuit 4 and the DC bus 3. In normal condition, the energy storage apparatus 300 will not be coupled to the equipment grounding point GND (that is, the ground fault has not occurred yet), so the path from the energy storage apparatus 300 to the equipment grounding point GND is represented as a dotted line. Therefore, in normal condition, the equivalent circuit of the three-phase uninterruptible power apparatus shown in FIG. 2 is composed of the equipment grounding point GND, the second detection end B, the AC/DC conversion circuit 2, the DC/AC conversion circuit 4, the DC bus 3, and the energy storage apparatus 300 coupled in series.

In one embodiment, a zero-sequence voltage ZSV injected into each AC phase by the DC/AC conversion circuit 4 may also be included between the DC/AC conversion circuit 4 and the DC bus 3. The zero-sequence voltage ZSV may be usually used to reduce the bus voltage Vbus of the DC bus 3 to improve the power conversion efficiency, or it can be used to reduce the switching frequency of the internal power switches of the DC/AC conversion circuit 4 to improve the power conversion efficiency, or it can be used to reduce the harmonics of the AC current. Therefore, the DC/AC conversion circuit 4 can selectively inject or not inject the zero-sequence voltage ZSV into each AC phase according to the requirements for improving efficiency or improving power quality. In another embodiment, the DC/AC conversion circuit 4 does not inject the zero-sequence voltage ZSV into each AC phase, and therefore the block of the zero-sequence voltage ZSV of the equivalent circuit in FIG. 2 will be directly short-circuited and no longer exist. Incidentally, the equivalent circuit analysis and voltage waveforms of the ground fault in the present disclosure are based on the case that the DC/AC conversion circuit 4 has injected zero-sequence voltage ZSV as an example. However, the actual condition is not limited to this, and the condition without zero-sequence voltage ZSV injected is also applicable to the ground fault detection apparatus and the detection method disclosed in the present disclosure. In addition, if the zero-sequence voltage ZSV is injected, the AC component of the zero-sequence voltage ZSV (as shown in FIG. 4B) will be carried on the detection voltage Vab. In this condition, the AC component of the zero-sequence voltage ZSV carried on the detection voltage Vab should be removed, so that the DC component of the detection voltage Vab can be used to determine whether a ground fault occurs and where the ground fault occurs. If the zero-sequence voltage ZSV is not injected, the value of the detection voltage Vab itself is actually equal to the voltage value of its DC component.

Figure 3:
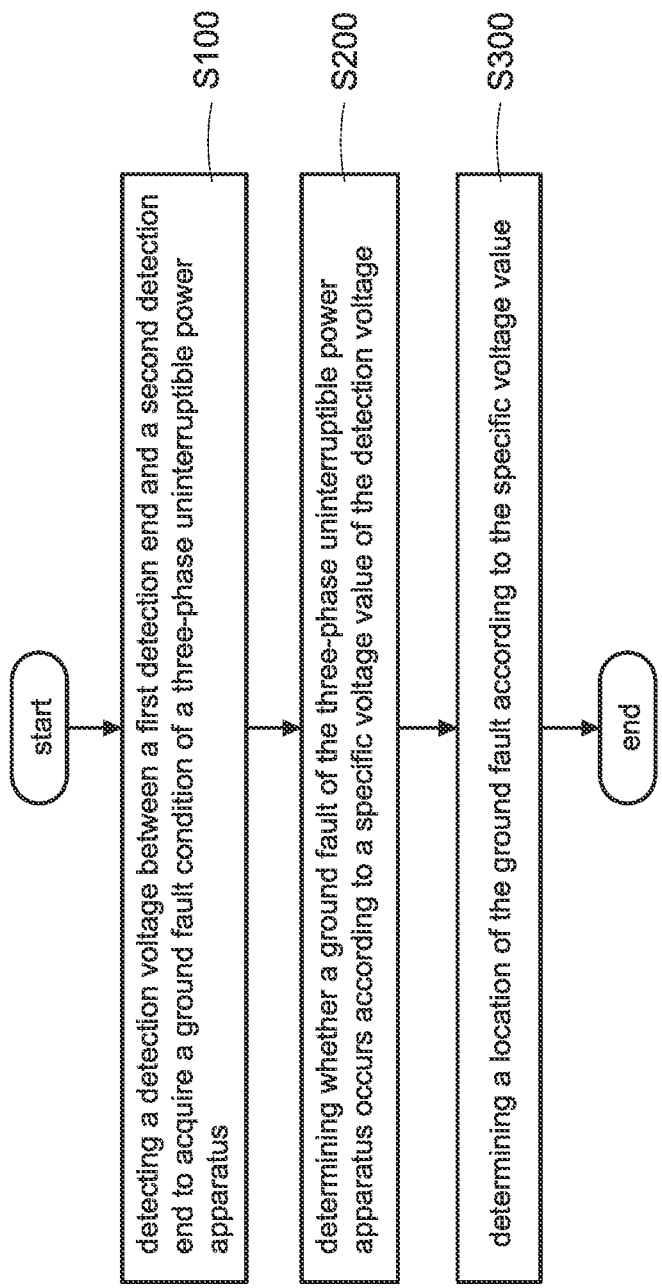
FIG. 3 is a flowchart of a method of detecting a ground fault of the three-phase uninterruptible power apparatus according to the present disclosure.

Please refer to FIG. 3, which shows a flowchart of a method of detecting a ground fault of the three-phase uninterruptible power apparatus according to the present disclosure, also refer to FIG. 1A, FIG. 1B, and FIG. 2. The method of detecting a ground fault is used to detect the ground fault of the three-phase uninterruptible power apparatus (200, 200') as shown in FIG. 1A and FIG. 1B. The method includes steps of: detecting a detection voltage between a first detection end and a second detection end to acquire a ground fault condition of the three-phase uninterruptible power apparatus (S100). In one embodiment, a first detection end A of a ground fault detection apparatus 100 is coupled to a first filter circuit 1 and a second filter circuit 5, and a second detection end B of the ground fault detection apparatus 100 is coupled to an equipment grounding point GND so that a detection circuit 100-1 of the ground fault detection apparatus 100 is used to detect a detection voltage Vab between the first detection end A and the second detection end B. In particular, the equipment grounding point GND is coupled to a first end of a grounding resistor Rg, and a second end of the grounding resistor Rg is coupled to a neutral point N of a first three-phase power source (R1, S1, T1), and the three-phase power source (R1, S1, T1) is coupled to a first AC side 200-1. Afterward, determining whether a ground fault of the three-phase uninterruptible power apparatus occurs according to a specific voltage value of the detection voltage (S200). In one embodiment, when the voltage value of the DC component of the detection voltage Vab of the ground fault detection apparatus 100 is 0 volt (or very close to 0 volt), it means that the three-phase uninterruptible power apparatus (200, 200') does not have a ground fault. On the contrary, when the voltage value of the DC component of the detection voltage Vab of the ground fault detection apparatus 100 changes to the specific voltage value, it is determined that the three-phase uninterruptible power apparatus (200, 200') has a ground fault. Finally, determining a location of the ground fault according to the specific voltage value (S300).

Figure 4A:
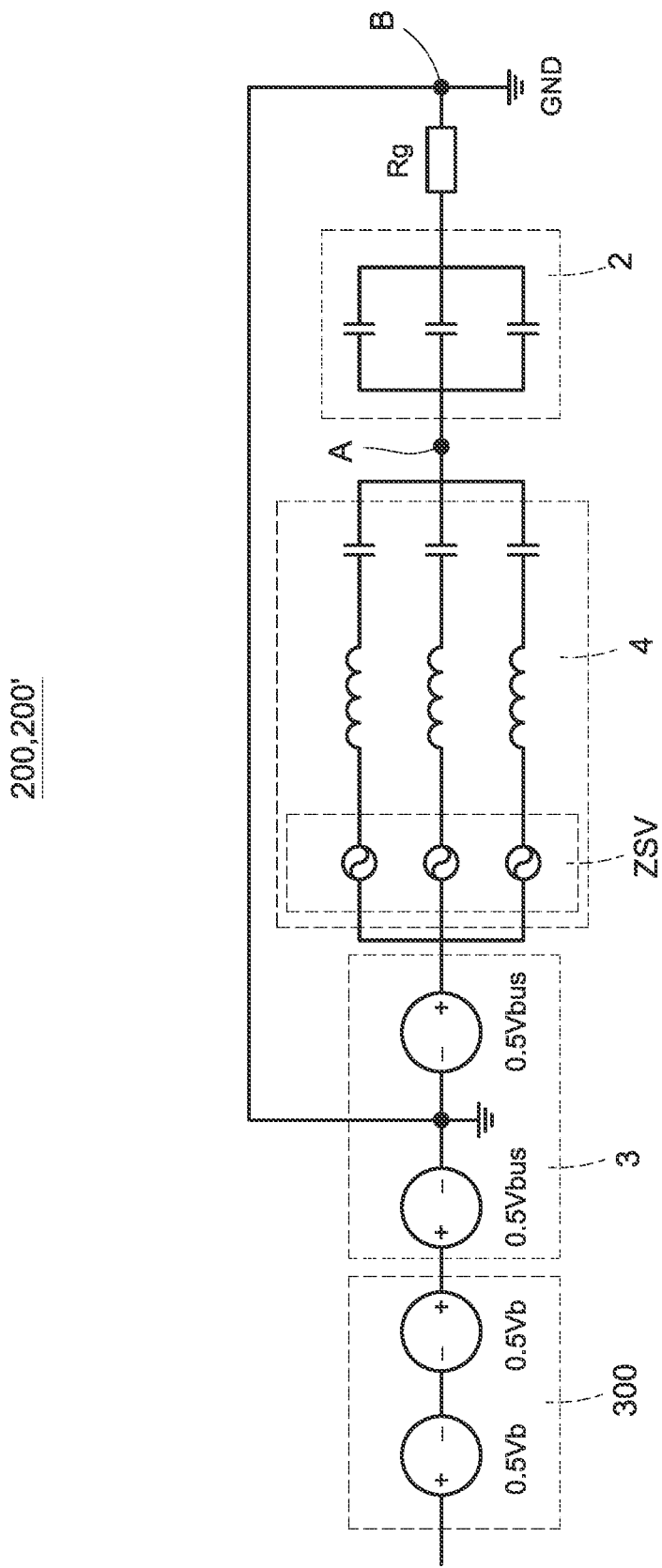
FIG. 4A is an equivalent circuit diagram of the three-phase uninterruptible power apparatus when the ground fault occurs at a negative side of a DC bus according to the present disclosure.
Figure 4B:
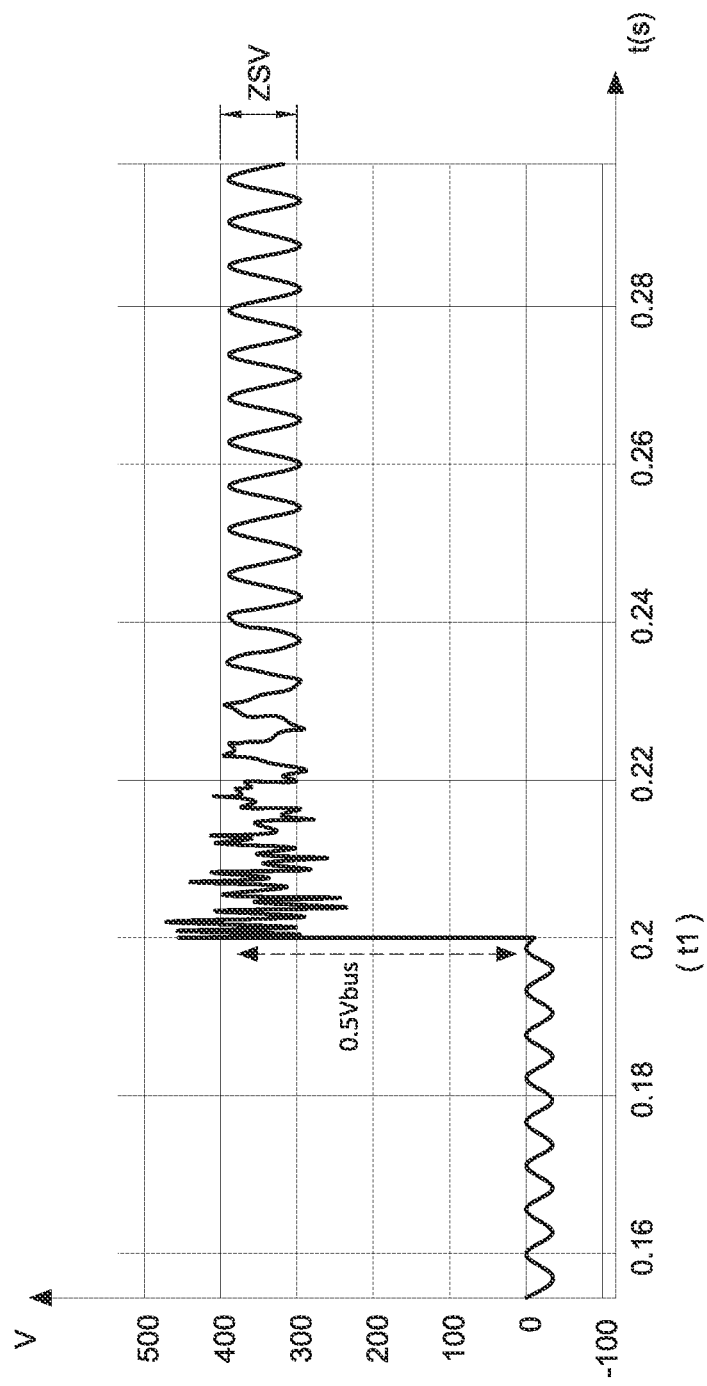
FIG. 4B is a waveform of a detection voltage of the ground fault detection apparatus when the ground fault occurs at the negative side of the DC bus according to the present disclosure.

Please refer to FIG. 4A, which shows an equivalent circuit diagram of the three-phase uninterruptible power apparatus when the ground fault occurs at a negative side of a DC bus according to the present disclosure, and please refer to FIG. 4B, which shows a waveform of a detection voltage of the ground fault detection apparatus when the ground fault occurs at the negative side of the DC bus according to the present disclosure, and also refer to FIG. 1 to FIG. 3. Take the three-phase uninterruptible power apparatus 200 in FIG. 1 as an example, incorporating the method of detecting the ground fault in FIG. 3. At time t1 shown in FIG. 4B, the DC bus 3 occurs a ground fault, therefore a physical grounding path between the DC bus 3 and the equipment grounding point GND shown in FIG. 4A is established. Due to the change of the ground equivalent path, the detection voltage Vab changes to the bus voltage Vbus (as one example of the specific voltage value) related to the DC bus 3, so the specific voltage value may be used to indicate whether the DC bus 3 has a ground fault. Specifically, the ground fault occurs at the negative side 3− of the DC bus 3 at time t1 shown in FIG. 4B, so the equivalent circuit of the three-phase uninterruptible power apparatus 200 changes to FIG. 4A. In this condition, the specific voltage value of the DC component of the detection voltage Vab changes from 0 volt to approximately half of the positive value of the bus voltage Vbus (+0.5*Vbus), therefore the specific voltage value can be used to indicate that the location of the ground fault is the negative side 3− of the DC bus 3. In particular, the above-mentioned specific voltage value may actually vary within a certain range due to the difference in parasitic parameters of the electronic components in the circuit and the measurement errors. For example, the variation range of the measured specific voltage value is about ±15% of the positive half of the bus voltage Vbus. That is, the specific voltage value, which is half of the positive value of the bus voltage Vbus (+0.5*Vbus), has a specific variation range, and this specific variation range for detecting the ground fault can be set according to the actual needs of the user (for example, but not limited to, the range could be set from +10% and −20%), not limited to ±15%.

Figure 4C:
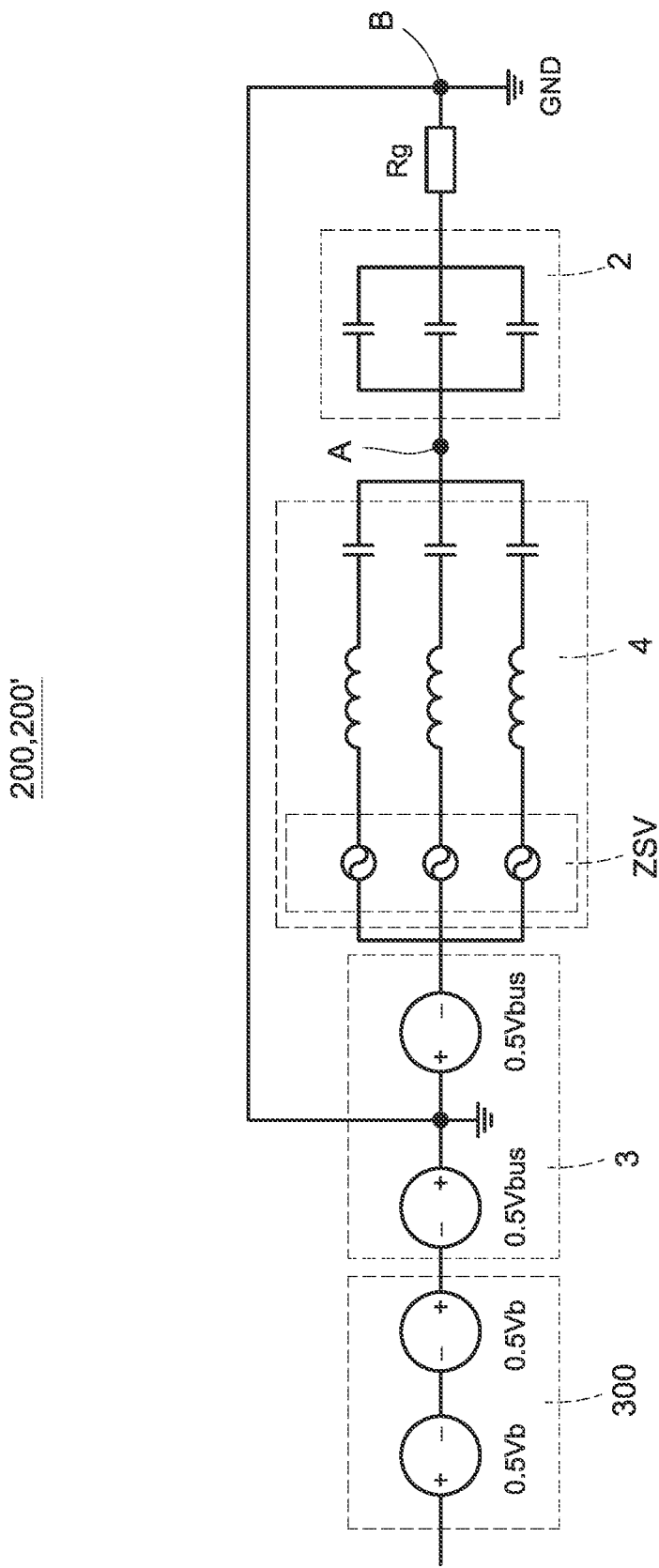
FIG. 4C is an equivalent circuit diagram of the three-phase uninterruptible power apparatus when the ground fault occurs at a positive side of the DC bus according to the present disclosure.
Figure 4D:
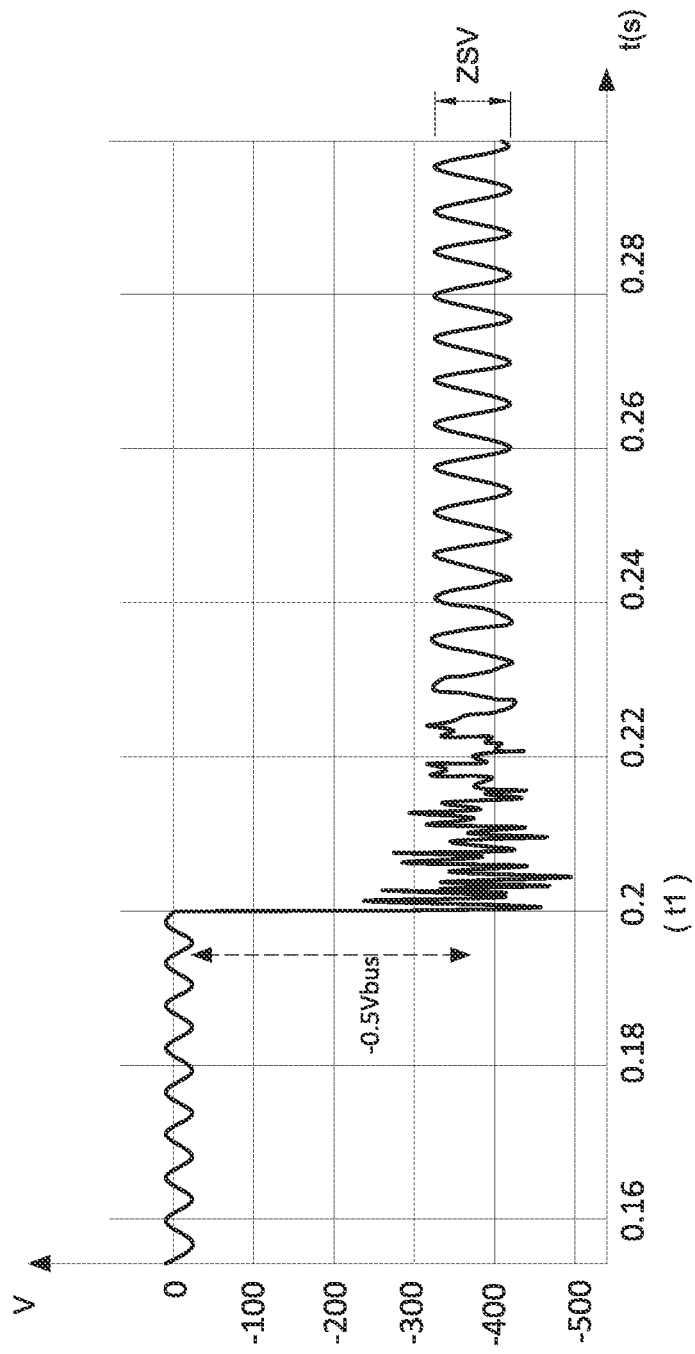
FIG. 4D is a voltage waveform of the detection voltage of the ground fault detection apparatus when the ground fault occurs at the positive side of the DC bus according to the present disclosure.

Please refer to FIG. 4C, which shows an equivalent circuit diagram of the three-phase uninterruptible power apparatus when the ground fault occurs at a positive side of the DC bus according to the present disclosure, and please refer to FIG. 4D, which shows a voltage waveform of the detection voltage of the ground fault detection apparatus when the ground fault occurs at the positive side of the DC bus according to the present disclosure, and also refer to FIG. 1 to FIG. 4B. Specifically, the ground fault occurs at the positive side 3+ of the DC bus 3 at time t1 shown in FIG. 4D, so the equivalent circuit of the three-phase uninterruptible power apparatus 200 changes to FIG. 4C. In this condition, the specific voltage value of the DC component of the detection voltage Vab changes from 0 volt to approximately half of the negative value of the bus voltage Vbus (−0.5*Vbus), therefore the specific voltage value can be used to indicate that the location of the ground fault is the positive side 3+ of the DC bus 3. In one embodiment, the method of detecting the ground fault shown in FIG. 4A to FIG. 4D is applicable to the three-phase uninterruptible power apparatus (200, 200') in FIG. 1A or FIG. 1B.

Figure 5A:
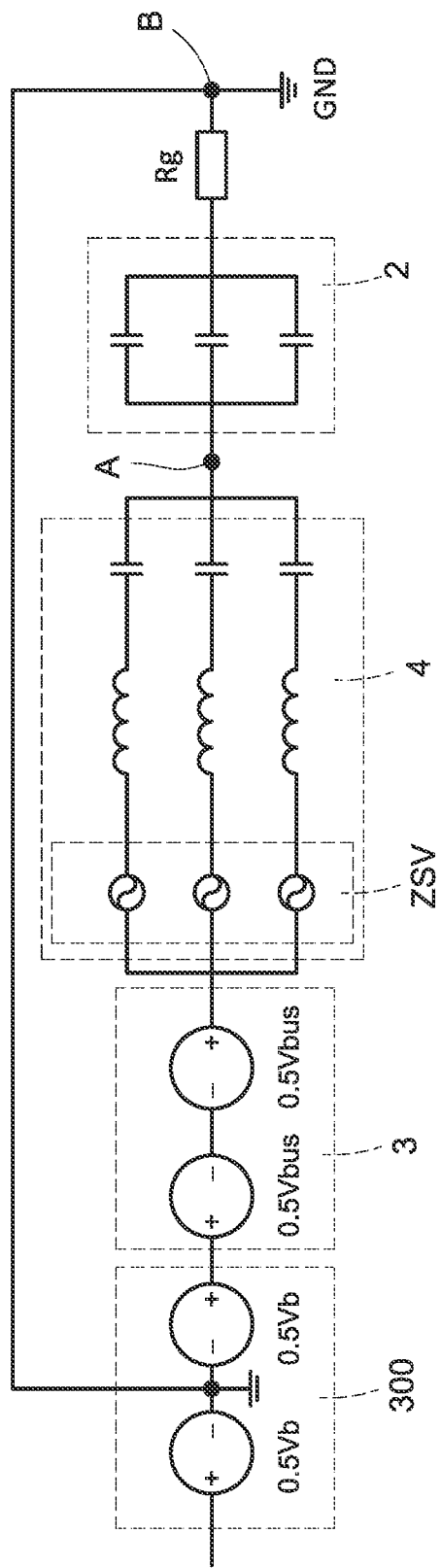
FIG. 5A is an equivalent circuit diagram of the three-phase uninterruptible power apparatus when the ground fault occurs at a negative electrode of an energy storage apparatus according to the present disclosure.
Figure 5B:
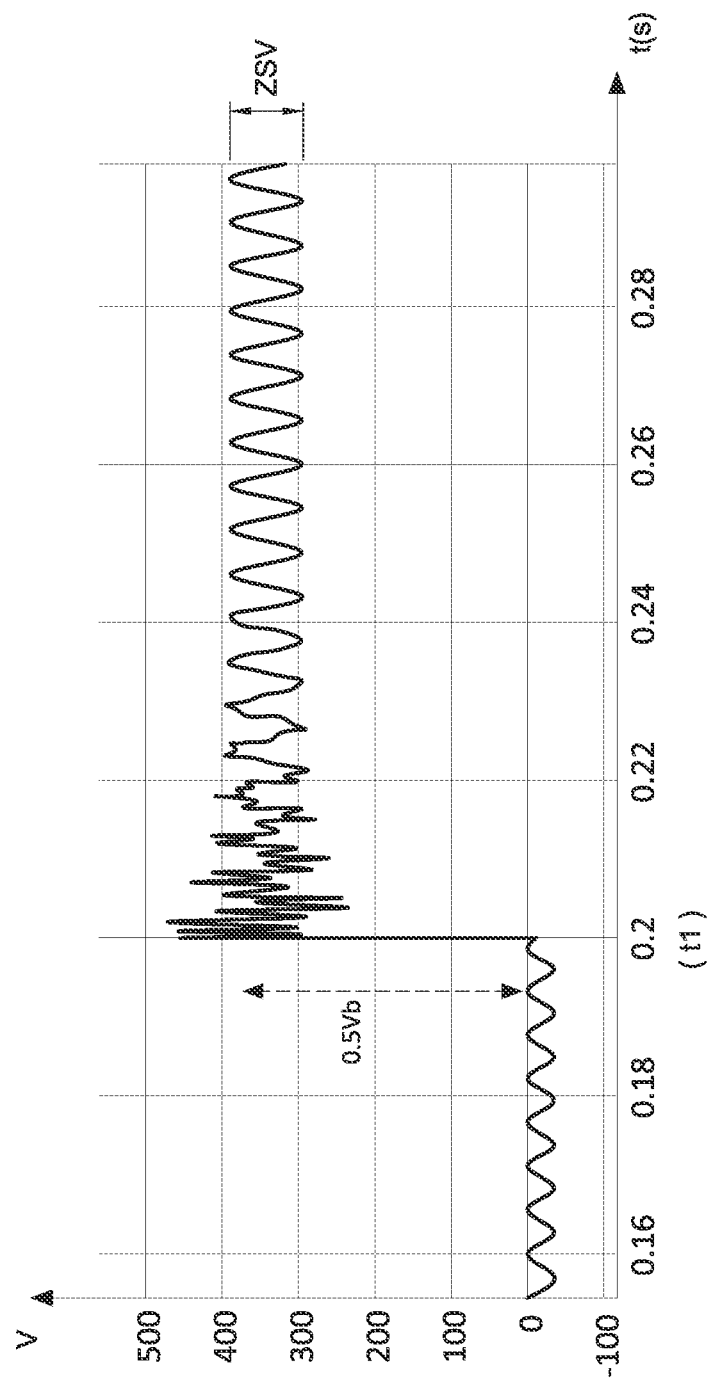
FIG. 5B is a voltage waveform of the detection voltage of the ground fault detection apparatus when the ground fault occurs at the negative electrode of the energy storage apparatus according to the present disclosure.

Please refer to FIG. 5A, which shows an equivalent circuit diagram of the three-phase uninterruptible power apparatus when the ground fault occurs at a negative electrode of an energy storage apparatus according to the present disclosure, and please refer to FIG. 5B, which shows a voltage waveform of the detection voltage of the ground fault detection apparatus when the ground fault occurs at the negative electrode of the energy storage apparatus according to the present disclosure, and also refer to FIG. 1 to FIG. 4D. Take the three-phase uninterruptible power apparatus 200 in FIG. 1 as an example, and incorporating the method of detecting the ground fault in FIG. 3. At time t1 shown in FIG. 5B, a ground fault occurs at the energy storage apparatus 300, therefore a physical grounding path between the energy storage apparatus 300 and the equipment grounding point GND shown in FIG. 5A is established. Due to the change of the ground equivalent path, the detection voltage Vab changes to the energy storage voltage Vb (as one example of the specific voltage value) related to the energy storage apparatus 300, so the specific voltage value may be used to indicate whether the energy storage apparatus 300 has a ground fault. Specifically, the ground fault occurs at the negative electrode 300− of the energy storage apparatus 300 at time t1 shown in FIG. 5B, so the equivalent circuit of the three-phase uninterruptible power apparatus 200 changes to FIG. 5A. In this condition, the specific voltage value of the DC component of the detection voltage Vab changes from 0 volt to approximately half of the positive value of the energy storage voltage Vb (+0.5*Vb), therefore the specific voltage value can be used to indicate that the location of the ground fault is the negative electrode 300− of the energy storage apparatus 300.

Figure 5C:
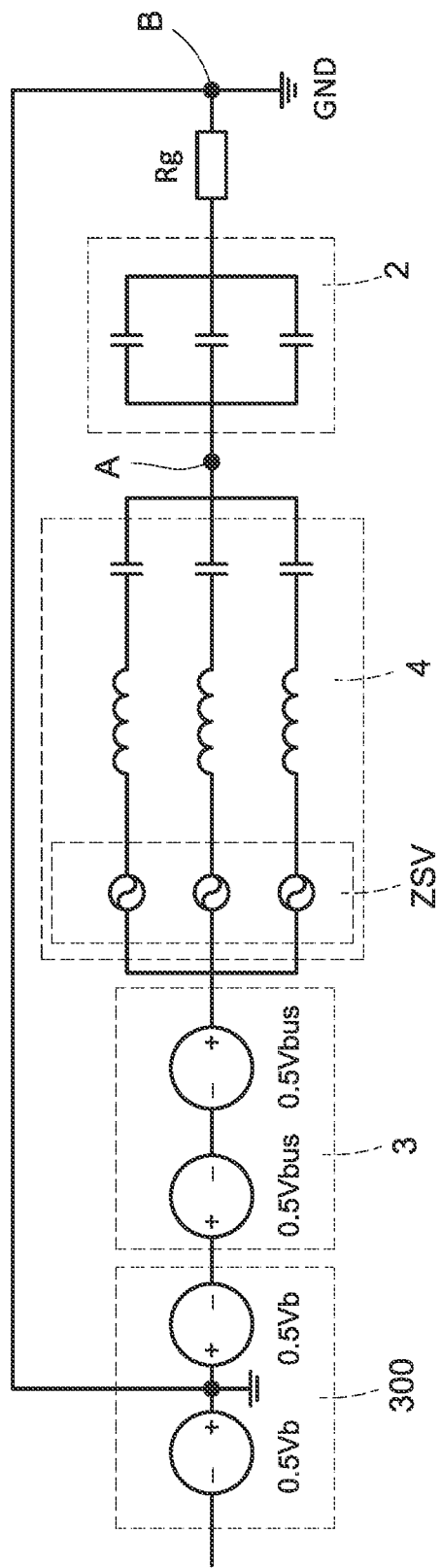
FIG. 5C is an equivalent circuit diagram of the three-phase uninterruptible power apparatus when the ground fault occurs at a positive electrode of the energy storage apparatus according to the present disclosure.
Figure 5D:
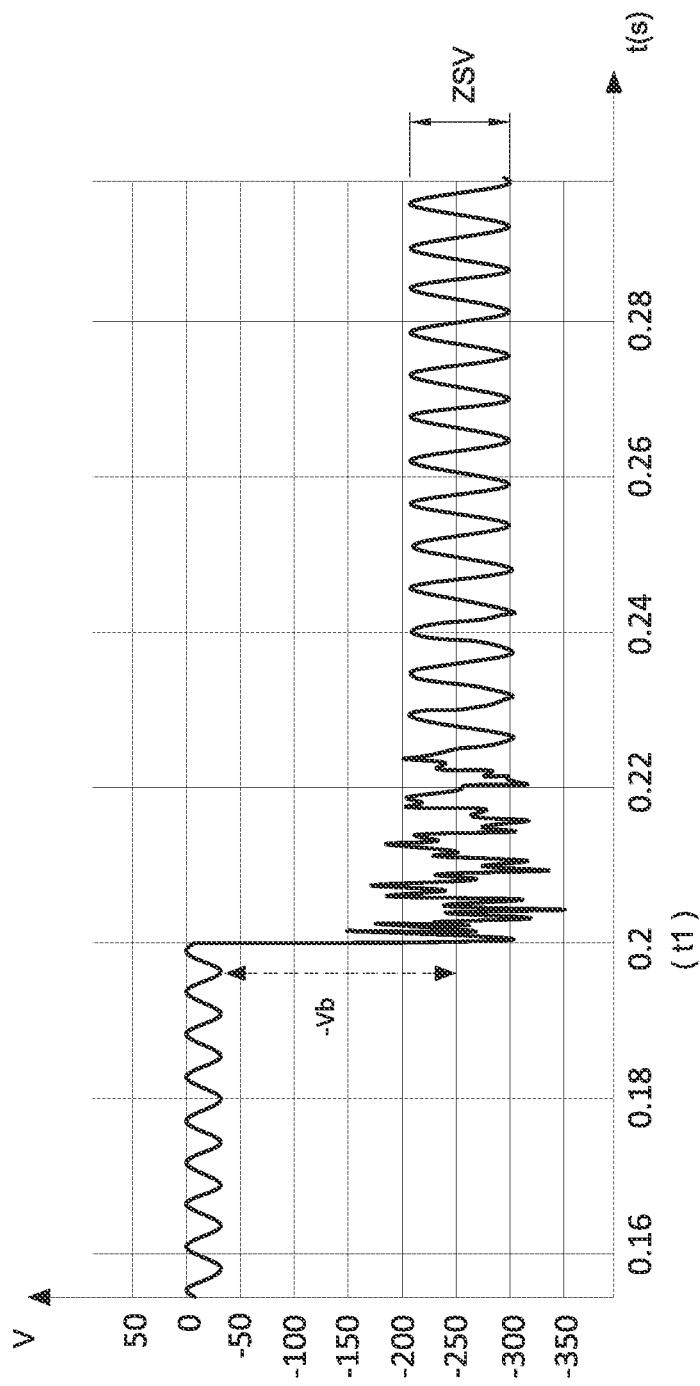
FIG. 5D is a voltage waveform of the detection voltage of the ground fault detection apparatus when the ground fault occurs at the positive electrode of the energy storage apparatus according to the present disclosure.

Please refer to FIG. 5C, which shows an equivalent circuit diagram of the three-phase uninterruptible power apparatus when the ground fault occurs at a positive electrode of the energy storage apparatus according to the present disclosure, and please refer to FIG. 5D, which shows a voltage waveform of the detection voltage of the ground fault detection apparatus when the ground fault occurs at the positive electrode of the energy storage apparatus according to the present disclosure, and also refer to FIG. 1 to FIG. 5B. Specifically, the ground fault occurs at the positive electrode 300+ of the energy storage apparatus 300 at time t1 shown in FIG. 5D, so the equivalent circuit of the three-phase uninterruptible power apparatus 200 changes to FIG. 5C. In this condition, the specific voltage value of the DC component of the detection voltage Vab changes from 0 volt to approximately half of the negative value of the energy storage voltage Vb (−0.5*Vb), therefore the specific voltage value can be used to indicate that the location of the ground fault is the positive electrode 300+ of the energy storage apparatus 300. In one embodiment, the method of detecting the ground fault shown in FIG. 5A to FIG. 5D is applicable to the three-phase uninterruptible power apparatus (200) in FIG. 1A.

Figure 6A:
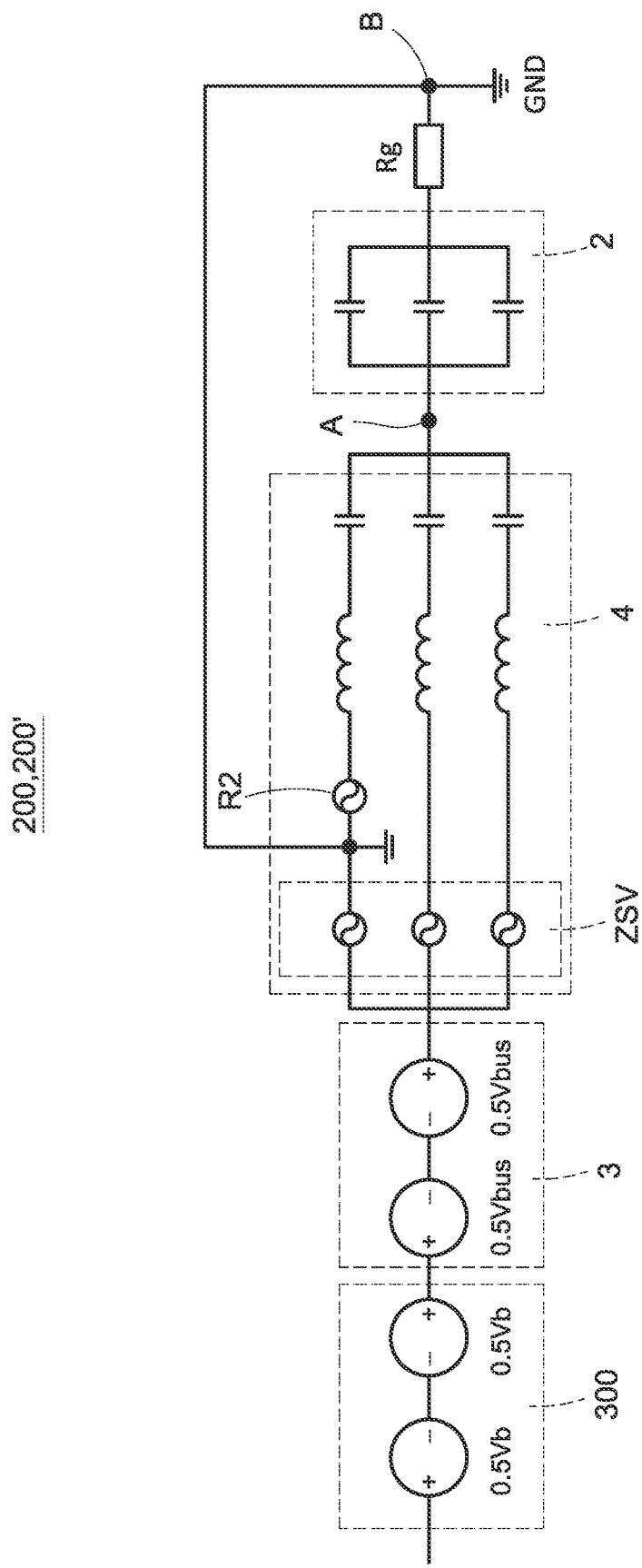
FIG. 6A is an equivalent circuit diagram of the three-phase uninterruptible power apparatus when the ground fault occurs at one specific phase of an AC side of a DC/AC conversion circuit according to the present disclosure.
Figure 6B:
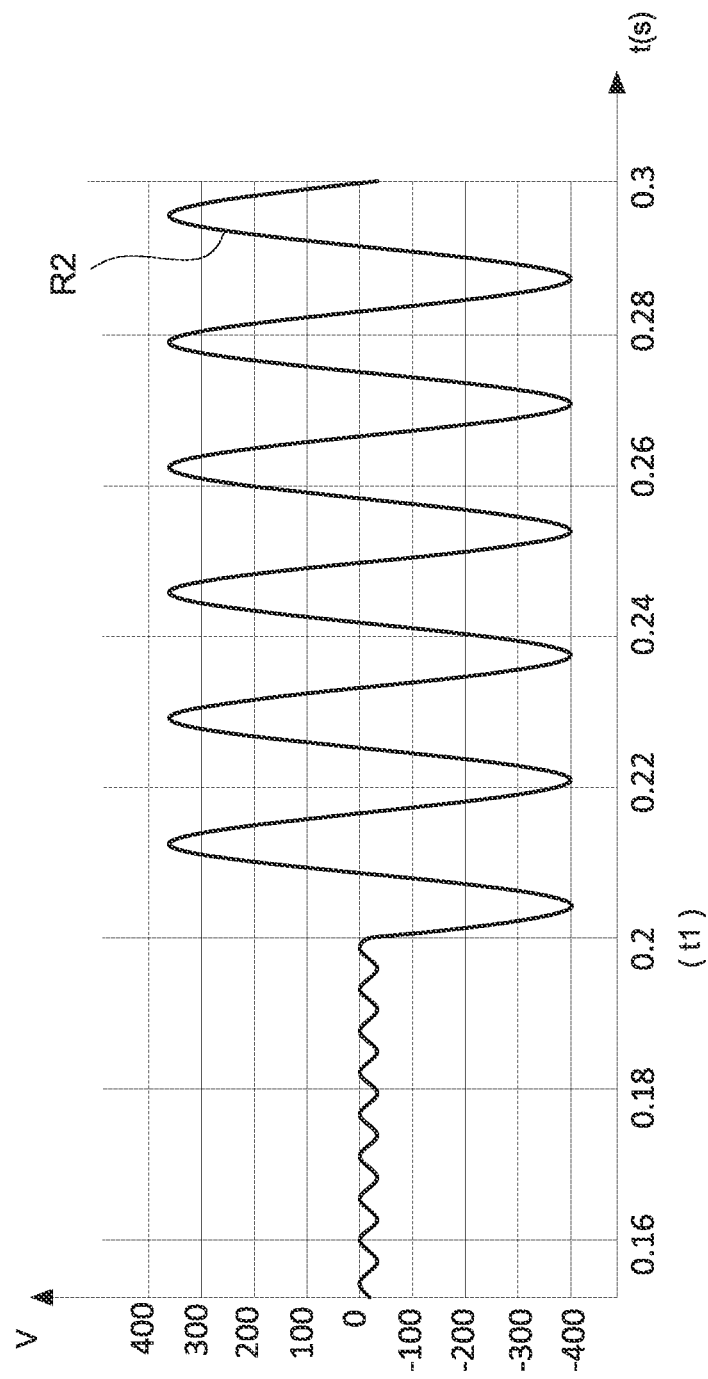
FIG. 6B is a voltage waveform of the detection voltage of the ground fault detection apparatus when the ground fault occurs at the specific phase of the AC side of the DC/AC conversion circuit according to the present disclosure.

Please refer to FIG. 6A, which shows an equivalent circuit diagram of the three-phase uninterruptible power apparatus when the ground fault occurs at one specific phase of an AC side of a DC/AC conversion circuit according to the present disclosure, and please refer to FIG. 6B, which shows a voltage waveform of the detection voltage of the ground fault detection apparatus when the ground fault occurs at the specific phase of the AC side of the DC/AC conversion circuit according to the present disclosure, and also refer to FIG. 1 to FIG. 5D. Take the three-phase uninterruptible power apparatus 200 in FIG. 1 as an example, and incorporating the method of detecting the ground fault in FIG. 3. At time t1 shown in FIG. 6B, a ground fault occurs at one phase (take the R phase as an example) of the AC side of the DC/AC conversion circuit 4, therefore a physical grounding path between the R phase of the DC/AC conversion circuit 4 and the equipment grounding point GND shown in FIG. 6A is established. Due to the change of the ground equivalent path, the detection voltage Vab changes to the R phase voltage R2 (as one example of the specific voltage value) related to the R phase of the DC/AC conversion circuit 4, so the specific voltage value may be used to indicate whether the R phase of the DC/AC conversion circuit 4 has a ground fault. In this condition, the equivalent circuit of the three-phase uninterruptible power apparatus 200 changes to FIG. 6A, so that the specific voltage value of the DC component of the detection voltage Vab changes from 0 volt to an AC voltage opposite to the R phase voltage R2 (i.e., −R2), therefore the specific voltage value can be used to indicate that the location of the ground fault is the R phase (AC side) of the DC/AC conversion circuit 4. In one embodiment, the ground fault circumstances of the other two phases (i.e., the S phase and the T phase) are also the same with the abovementioned exemplary phase (the R phase), so the detail description is omitted here for conciseness. In one embodiment, the method of detecting the ground fault shown in FIG. 6A and FIG. 6B is applicable to the three-phase uninterruptible power apparatus (200, 200') in FIG. 1A or FIG. 1B.

Please refer to FIG. 4A to FIG. 6B again, in order to clearly interpret the relationship between the specific voltage value of the detection voltage Vab and various ground fault locations, the actual exemplary cases are listed in the following Table 1:

TABLE 1 the relationship between the specific voltage value of the detection voltage Vab and the ground fault location

| Ground Fault Location | Specific Voltage Value of the Detection Voltage (Vab) |
|---|---|
| the negative side (3−) of the DC bus (3) | 0.5 Vbus + ZSV (applicable to FIG. 1A or FIG. 1B) |
| the positive side (3+) of the DC bus (3) | −0.5 Vbus + ZSV (applicable to FIG. 1A or FIG. 1B) |
| the negative electrode (300−) of the energy storage apparatus (300) | 0.5 Vb + ZSV (applicable to FIG. 1A) |
| the positive electrode (300+) of the energy storage apparatus (300) | −0.5 Vb + ZSV (applicable to FIG. 1A) |
| one phase (R2, S2, or T2) of the second AC side (200-2) | opposite to the specific phase voltage (applicable to FIG. 1A or FIG. 1B) |

Remarks: Table 1 shows the condition that the zero-sequence voltage ZSV is injected. If the zero-sequence voltage ZSV is not injected, then the ZSV=0. If only the DC component of the detection voltage Vab is used for determination, it is not necessary to consider whether there is injected zero-sequence voltage ZSV.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A ground fault detection apparatus configured to detect a ground fault of a three-phase uninterruptible power apparatus, the three-phase uninterruptible power apparatus comprising an AC/DC conversion circuit, and a DC/AC conversion circuit coupled to the AC/DC conversion circuit through a DC bus, the ground fault detection apparatus comprising:

a detection circuit comprising a first detection end and a second detection end, said first detection end being coupled to a first filter circuit between the AC/DC conversion circuit and a first AC side, said first detection end being not only coupled to said first filter circuit, but also commonly coupled to a second filter circuit between the DC/AC conversion circuit and a second AC side, said second detection end being further coupled to an equipment grounding point of the three-phase uninterruptible power apparatus, said equipment grounding point being further coupled to a neutral point of a three-phase power source through a grounding resistor, said three-phase power source being further coupled to the first AC side, wherein the detection circuit indicates whether the three-phase uninterruptible power apparatus has a ground fault and a location where the ground fault occurs according to a detection voltage between the first detection end and the second detection end.

2. The ground fault detection apparatus as claimed in claim 1, wherein the detection circuit determines whether the three-phase uninterruptible power apparatus has the ground fault according to a specific voltage value of a DC component of the detection voltage.

3. The ground fault detection apparatus as claimed in claim 1,
wherein the first filter circuit comprises:
a first inductor assembly, a first end of the first inductor assembly being coupled to the three-phase power source through the first AC side, and a second end of the first inductor assembly being coupled to the AC/DC conversion circuit, and
a first capacitor assembly, a first end of the first capacitor assembly being coupled to the first inductor assembly, and a second end of the first capacitor assembly being coupled to the first detection end,
wherein the second filter circuit comprises:
a second inductor assembly, a first end of the second inductor assembly being coupled to the DC/AC conversion circuit, and a second end of the second inductor assembly being coupled to the load through the second AC side, and
a second capacitor assembly, a first end of the second capacitor assembly being coupled to the second inductor assembly, and a second end of the second capacitor assembly being coupled to the first detection end.

4. The ground fault detection apparatus as claimed in claim 1, wherein the three-phase uninterruptible power apparatus further comprises:
a DC/DC conversion circuit coupled to a positive side and a negative side of the DC bus and a positive electrode and a negative electrode of an energy storage apparatus.

5. The ground fault detection apparatus as claimed in claim 1, wherein the three-phase uninterruptible power apparatus further comprises:
a first capacitor, a first end of the first capacitor being coupled to a positive side of the DC bus, and a second end of the first capacitor being a midpoint,
a second capacitor, a first end of the second capacitor being coupled to a negative side of the DC bus, and a second end of the second capacitor being coupled to the midpoint,
a switch assembly having a first end, a second end, and a third end, said first end of the switch assembly being coupled to the three-phase power source through the first AC side, said second end of the switch assembly being coupled to the first filter circuit, said third end of the switch assembly being coupled to a positive electrode of an energy storage apparatus, and a negative electrode of the energy storage apparatus being coupled to the midpoint,
wherein the AC/DC conversion circuit is configured to convert a three-phase voltage of the three-phase power source into a bus voltage of the DC bus when the first end of the switch assembly is coupled to the second end of the switch assembly, and convert an energy storage voltage of the energy storage apparatus into the bus voltage when the second end of the switch assembly is coupled to the third end of the switch assembly.

6. The ground fault detection apparatus as claimed in claim 4, wherein the detection circuit comprises:

a detection resistor, a first end of the detection resistor being coupled to the first detection end, and a second end of the detection resistor being coupled to the second detection end, and
a control unit coupled to the detection resistor, said control unit being configured to determine whether the ground fault of the three-phase uninterruptible power apparatus occurs and a location of the ground fault according to the detection voltage provided by the detection resistor.

7. A method of detecting a ground fault of a three-phase uninterruptible power apparatus, the three-phase uninterruptible power apparatus comprising a first filter circuit, an AC/DC conversion circuit, a DC bus, a DC/AC conversion circuit, and a second filter circuit coupled in sequence, a common connection point between the first filter circuit and the second filter circuit being a first detection end, an equipment grounding point of the three-phase uninterruptible power apparatus being coupled to a second detection end, said equipment grounding point further being coupled to a neutral point of a three-phase power source through a grounding resistor, the three-phase power source being coupled to the first filter circuit, the method comprising steps of:
detecting a detection voltage between the first detection end and the second detection end,
determining whether a ground fault of the three-phase uninterruptible power apparatus occurs according to a specific voltage value of the detection voltage, and
determining a location of the ground fault according to the specific voltage value.

8. The method of detecting the ground fault as claimed in claim 7, wherein the detection voltage is related to a bus voltage of the DC bus, and the specific voltage value is used to indicate whether the DC bus has the ground fault.

9. The method of detecting the ground fault as claimed in claim 8, further comprising steps of:
determining that the location is at a negative side of the DC bus when the specific voltage value of a DC component of the detection voltage is detected to be approximately half of a positive value of the bus voltage, and
determining that the location is at a positive side of the DC bus when the specific voltage value of the DC component of the detection voltage is detected to be approximately half of a negative value of the bus voltage.

10. The method of detecting the ground fault as claimed in claim 7, wherein the detection voltage is related to a phase voltage of an AC side of the DC/AC conversion circuit, and the specific voltage value is used to indicate whether a phase corresponding to the phase voltage has the ground fault.

11. The method of detecting the ground fault as claimed in claim 7, wherein the three-phase uninterruptible power apparatus further comprises:
a DC/DC conversion circuit coupled between an energy storage apparatus and the DC bus,
wherein the detection voltage is related to an energy storage voltage of the energy storage apparatus, and the specific voltage value is used to indicate whether the energy storage apparatus has the ground fault.

12. The method of detecting the ground fault as claimed in claim 11, further comprising steps of:
determining the location is at a negative electrode of the energy storage apparatus when the specific voltage value of a DC component of the detection voltage is detected to be approximately half of a positive value of the energy storage voltage, and determining the location is at a positive side of the energy storage apparatus when the DC component with the specific voltage value of the detection voltage is detected to be approximately half of a negative value of the energy storage voltage.

\* \* \* \* \*